United States Patent [19]

Evans

[11] Patent Number: 4,611,337

[45] Date of Patent: Sep. 9, 1986

[54] MINIMAL LOGIC SYNCHRONOUS UP/DOWN COUNTER IMPLEMENTATIONS FOR CMOS

[75] Inventor: Michael W. Evans, Lynchburg, Va.

[73] Assignee: General Electric Company, Lynchburg, Va.

[21] Appl. No.: 527,470

[22] Filed: Aug. 29, 1983

[51] Int. Cl.$^4$ .......................................... H03K 23/04
[52] U.S. Cl. .................................... 377/123; 377/116
[58] Field of Search ............... 377/123, 115, 125, 126, 377/116; 307/272 A, 471

[56] References Cited

U.S. PATENT DOCUMENTS

| | | | |
|---|---|---|---|
| 3,243,600 | 3/1966 | Fatz | 377/116 |
| 3,588,475 | 6/1971 | Scott | 377/116 |
| 4,037,085 | 7/1977 | Minorikawa | 377/116 |

FOREIGN PATENT DOCUMENTS

| | | | |
|---|---|---|---|
| 1458303 | 2/1973 | United Kingdom . | |
| 2026744 | 7/1978 | United Kingdom | 377/116 |

OTHER PUBLICATIONS

"B-Directional Counter Using a Cyclic Pseudo-Random Number Generator", Electrotechnology, Jan. 1977, pp. 13–14.

Robert Brownstein, "Up–Down Counter Cuts Parts Count", Electronics, Jun. 8, 1978, p. 164.

Primary Examiner—John S. Heyman
Assistant Examiner—Karl Ohralik
Attorney, Agent, or Firm—Nixon & Vanderhye

[57] ABSTRACT

A binary up/down counter stage particularly suitable for CMOS implementation. The counter stage includes an exclusive OR gate having a first input for receiving a toggle signal, a flip-flop having a data input coupled to the output of the exclusive OR gate and Q and $\overline{Q}$ outputs, the Q output of which provides the stage output and a feedback to the second input of the exclusive OR gate, and a multiplexer having first and second inputs coupled to the Q and $\overline{Q}$ of the flip-flop respectively, the output of the multiplexer being logically ANDED with a toggle-in signal to provide a toggle-out signal for a further counter stage in cascade.

9 Claims, 5 Drawing Figures

MINIMAL LOGIC SYNCHRONOUS UP/DOWN COUNTER IMPLEMENTATIONS FOR CMOS

BACKGROUND OF THE INVENTION

This invention relates in general to binary up/down (U/D) counters. More specifically, the present invention provides specific circuits for up/down binary counters that are particularly well suited for CMOS integration.

Up/down counters are now well known and have become standard "building blocks" used by digital design engineers. They have a wide range of application in various digital devices, such as, for example, communication equipment. Traditional circuit implementations for U/D counters require large amounts of logic gates to produce the desired up or down count function. For example, referring to FIG. 1 (prior art) there is shown a known circuit implementation for an "off-the-shelf" binary counter. The binary counter shown in circuit is a Texas Instruments SN54S169 or SN74S169.

For many applications, it is not terribly significant how many logic gates are needed to implement a binary counter circuit. In this particular example, the Nth stage requires an input NAND gate having N-1 inputs, an N input NOR gate and N- AND gates.

In the particular example shown in FIG. 1 (PRIOR ART) four stages (stage #1 ... stage #4) of binary counter are illustrated. Stage #4 requires a three input NAND gate 10, four AND gates 14 and a four input NOR gate 12. As can be seen from the illustrated arrangement a substantial number of gates are required for implementing the U/D counter.

Although the FIG. 1 (PRIOR ART) circuit arrangement may be quite suitable for many types of integration, such as for example TTL and others, it is not suitable for CMOS integrations because of the large number of logic gates required.

SUMMARY OF THE INVENTION

Therefore the present invention provides various circuits for U/D counters that are more suitable for CMOS integration. The concept common to all of the circuits set forth herein is that they utilize a multiplexer to eliminate logic functions that would otherwise be provided by plural logic gates. In TTL designs, the use of a multiplexer in place of logic gates would not represent a circuit architectural savings. This is because it takes plural gates to fabricate a TTL multiplexer. However, in CMOS implementations, a two input multiplexer can be made very simply. CMOS is particularly suitable for building a multiplexer logic function. Thus, for CMOS U/D counters, the circuits provided by this invention require considerably less circuit architecture than traditional implementations would require.

In one aspect, the present invention provides a single stage of an up/down counter that can be cascaded with other stages to form an N-stage counter. The single stage is intended to operate from external toggle-in, CLOCK, and U/D control signals. A two input exclusive OR gate has a first input coupled to the externally generated toggle-in signal for enabling the counter to count falling edges of the CLOCK signal. An output of the exclusive OR gate is coupled to the data input of a flip-flop having Q and $\bar{Q}$ outputs. The CLOCK input of the flip-flop is coupled to the externally generated CLOCK signal. The Q output of the flip-flop is coupled to the second input of the exclusive OR gate and provides an output indicating the state of the counter stage. The Q and $\bar{Q}$ outputs of the flip-flop are coupled respectively to "0" and "1" inputs of a two input multiplexer. The multiplexer's "S" input is coupled to the U/D control signal, externally provided. The Y output of the multiplexer is coupled to a first input of an AND gate, the second input of which is coupled to the toggle-in signal. The output of the AND gate provides a toggle-out signal to the next stage of the counter.

The stages as above described can be cascaded to form an N stage counter. To cascade the stages, the toggle-in signal is coupled to the first stage and the toggle-out signal of the first stage is coupled to the input of the next stage in cascade, etc. One minor disadvantage of such an implementation is that speed is limited because of multiple gate delays. A somewhat faster implementation is shown in an alternative embodiment.

In the alternative embodiment of an N-stage binary up/down counter, each stage requires an N input AND gate, one exclusive OR gate and one multiplexer. The first stage is similar to the single stage described with the toggle input coupled to one input of an exclusive OR gate, the other input of which is a feedback signal from the Q output of the flip-flop. Successive stages in the cascade each include an AND gate having a number of inputs corresponding to the stage number. For example, the second stage utilizes a two input AND gate, the third stage requires a three input AND gate and the fourth stage requires a four input AND, etc. The inputs of the gates of each of the stages are coupled respectively to the toggle-in signal and to the multiplex output signals of each of the preceding stages in cascade. The outputs of the multiple input AND gates are coupled respectively to the second inputs of the exclusive OR gate in each stage.

BRIEF DESCRIPTION OF THE DRAWINGS

Specific circuit embodiments of the invention will be described with reference to the drawings forming a part of this application wherein.

DETAILED DESCRIPTION OF THE PREFERRED EMBODIMENT

Figure 2:
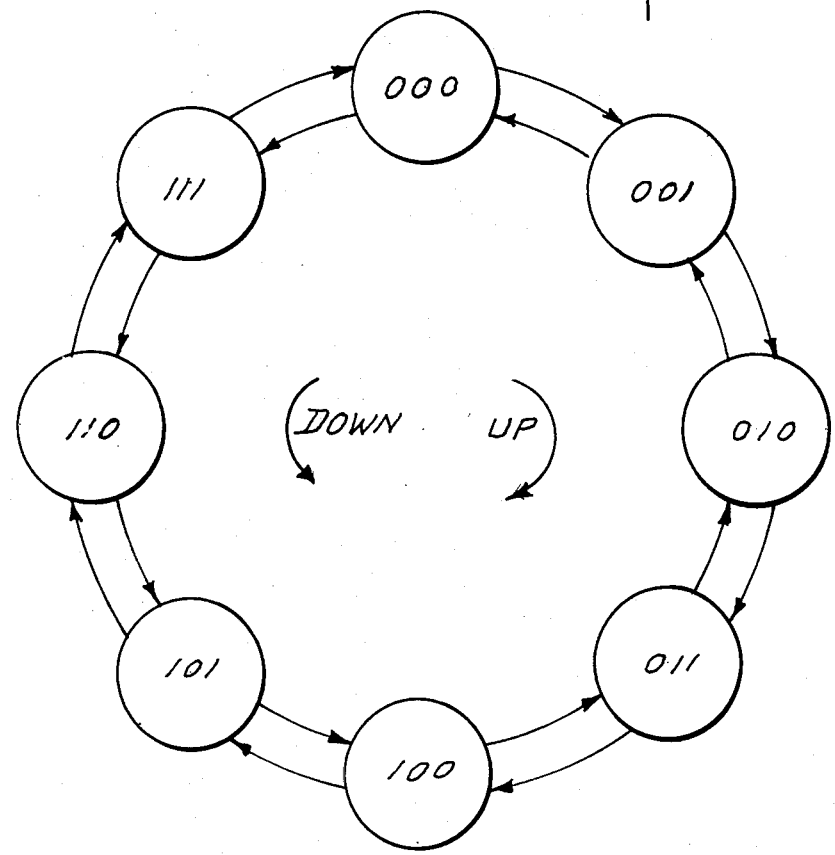
FIG. 2 is a state diagram for a three bit up/down counter.

Referring now to FIG. 2 there is shown a state diagram for a three bit U/D counter. Although only three bits are illustrated, the principle discussed with reference to this figure applies to all binary U/D counters. When the counter counts, it changes state as represented by moving from one circle to the next adjacent circle in the diagram. Moving from one circle to the next, certain bits change state and certain ones do not. Whether a given bit changes state depends on two things: (1) the state the counter is presently in and (2) whether the counter is counting "up" or "down".

By analyzing the simple case of a three bit counter, as illustrated, an extrapolating rule has been developed which governs the next state of the Nth bit of an up/down counter. This rule is as follows. When counting up, the Nth bit changes state if the first through N-1 bits are all ones. By a change of state, we mean that the state goes to "1" if it is a "0" and goes to "0" if it is a "1". When counting down, the Nth bit changes state if the first through N-1th bits are all "0".

This algorithm can be implemented in a very simple fashion using a multiplexer. A first such implementation showing a single stage of an up/down counter is shown in FIG. 3.

Figure 3:
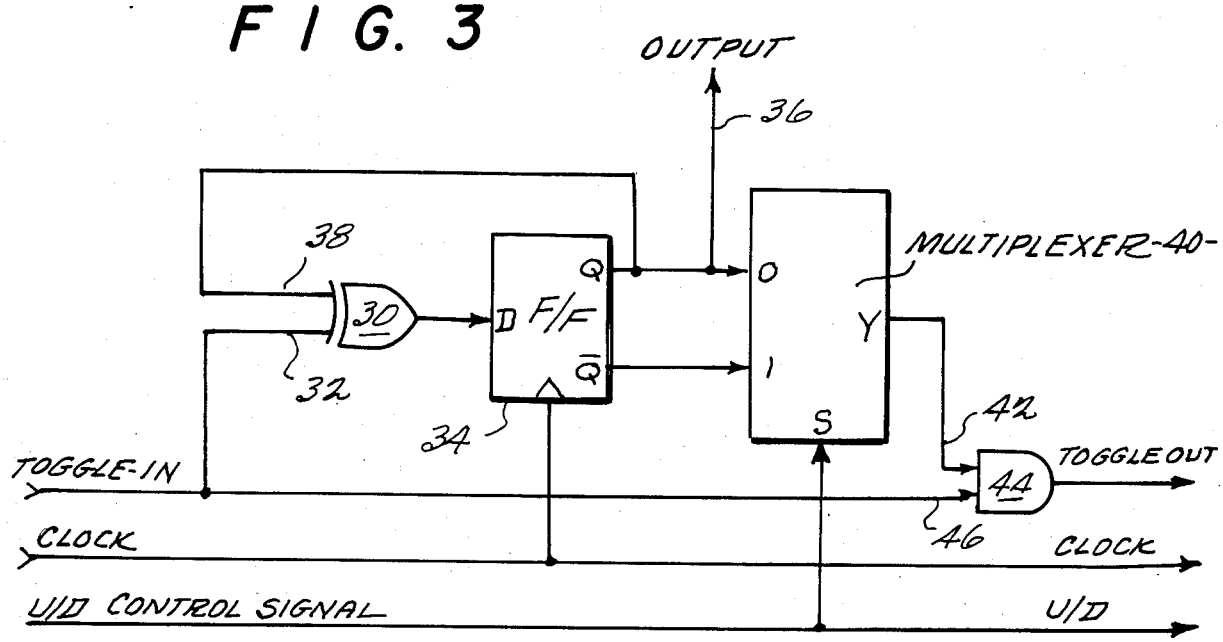
FIG. 3 is a circuit diagram of a single stage of a binary counter according to a first embodiment of the present invention.

Referring now to FIG. 3, there is shown a circuit diagram for a single stage (cell) of an up/down binary counter. In this particular implementation, the count occurs on the active edge of the CLOCK. The counter stage implementation assumes external toggle-in, CLOCK and an up/down (U/D) control signals. An exclusive-OR gate 30 has a first input 32 thereof coupled to the toggle-in signal. The output of exclusive OR gate 30 is coupled to a data input "D" of a flip-flop 34 having Q and $\overline{Q}$ outputs. The Q output of flip-flop 34 provides the stage output 36 and a feedback to a second input 38 of exclusive OR gate 30. The Q and $\overline{Q}$ outputs are coupled respectively to "0" and "1" inputs of a multiplexer 40 having an "S" input coupled to the U/D control signal and a Y output. The Y output of multiplexer 40 is coupled to a first input 42 of an AND gate 44, the second input 46 of which is coupled to the toggle-in signal. The output of AND gate 44 provides the toggle-out signal for the next stage of the counter.

Figure 4:
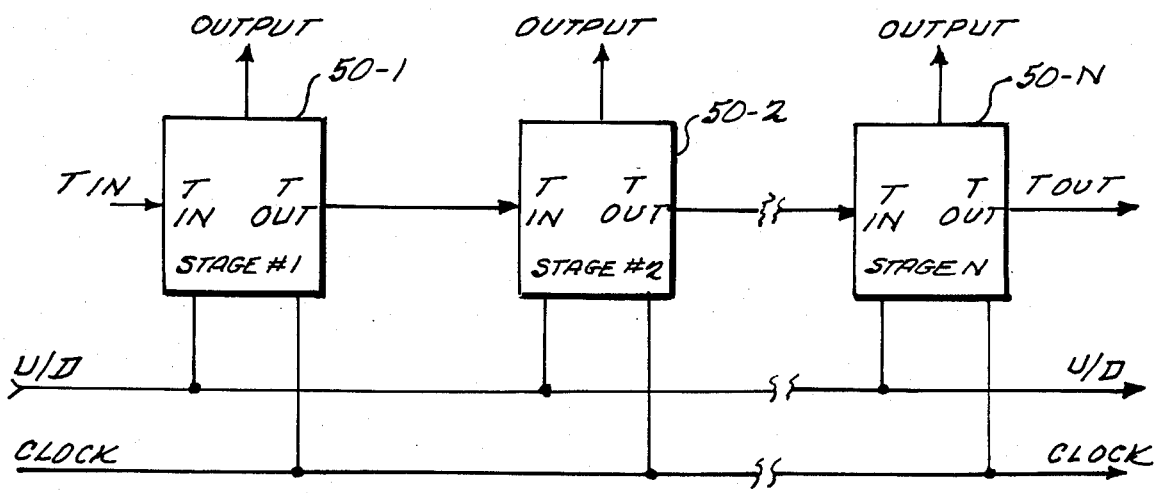
FIG. 4 is a multiple stage counter according to the present invention wherein each stage corresponds to the stage shown in circuit detail in FIG. 3.

Referring now to FIG. 4 there is shown in block diagram how to construct an N-stage binary counter. Each stage can be implemented in circuit as shown in FIG. 3. Thus, each stage 50 (50-1, 50-2 . . . 50-N) includes an exclusive OR gate such as gate 30, a flip-flop such as flip-flop 34, a multiplexer such as multiplexer 40 and an AND gate such as AND gate 44. A disadvantage of the implementation shown in FIG. 4 is that for counters having a large number of stages, the operating speed is limited because of multiple gate delays. A somewhat faster implementation is shown in FIG. 5.

Figure 1:
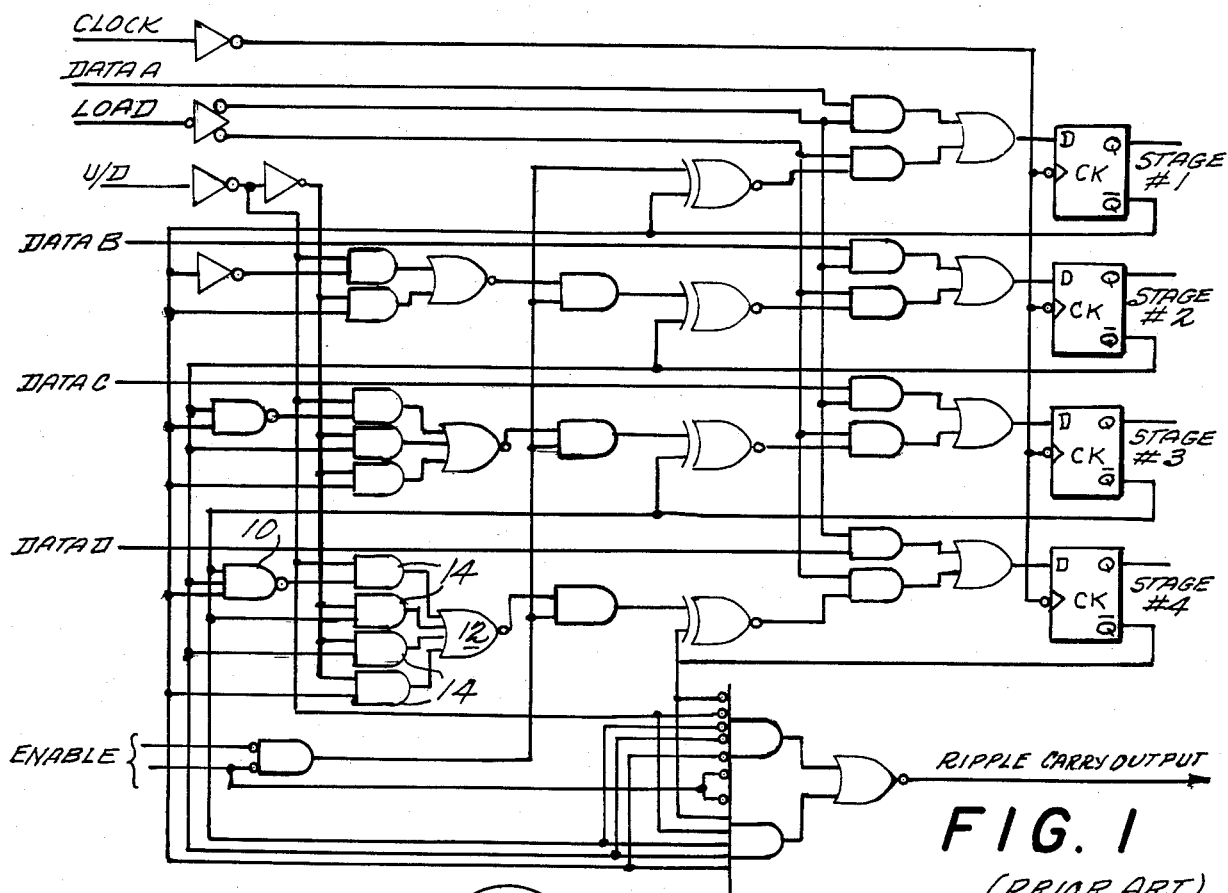
FIG. 1 is a circuit diagram of a traditional implementation of a binary counter in accordance with the prior art.
Figure 5:
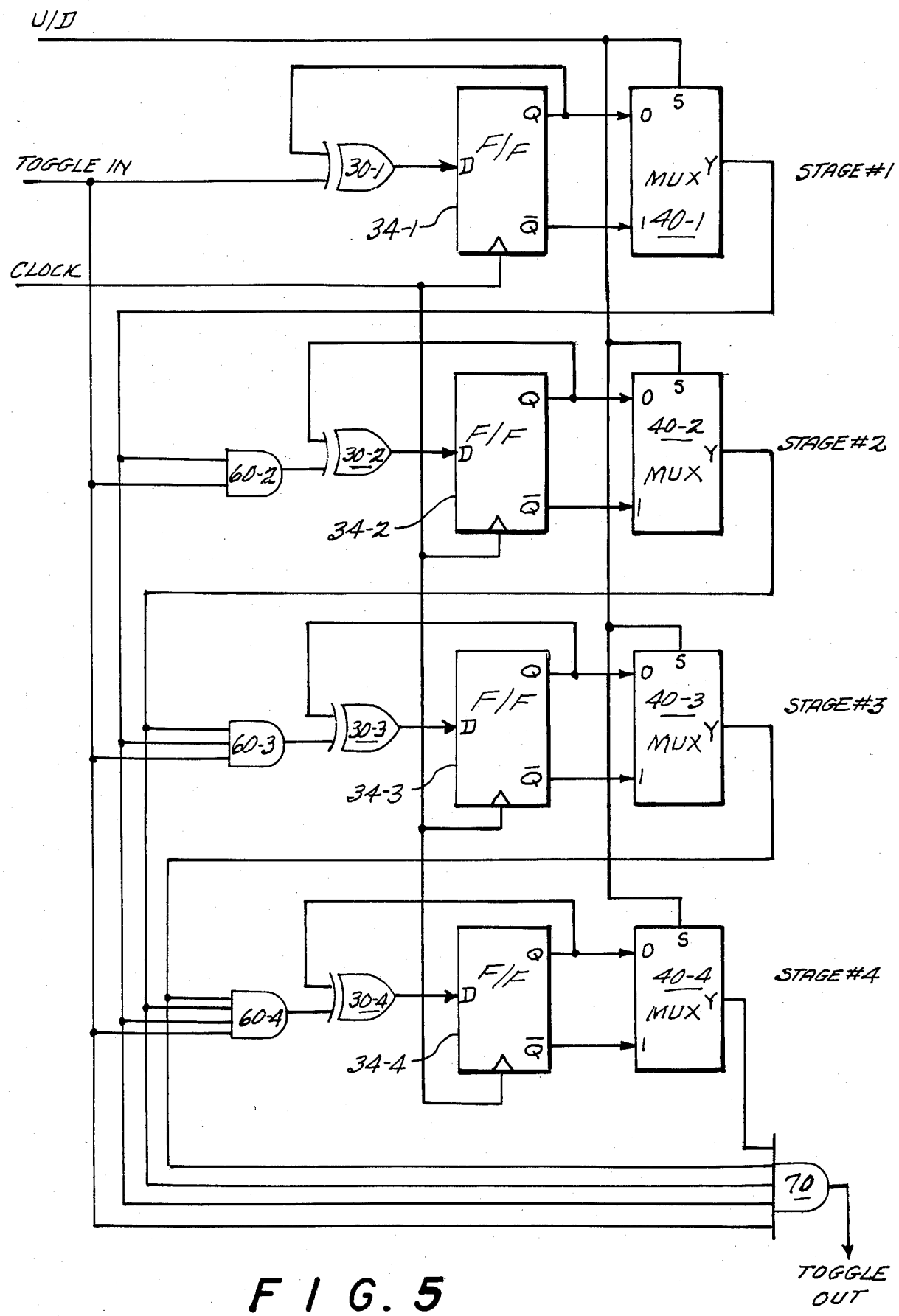
FIG. 5 is an alternative embodiment of a four stage binary U/D counter according to the present invention.

Referring now to FIG. 5 there is shown an alternative embodiment of an up/down binary counter according to the present invention. For purposes of illustration only, a four stage counter is illustrated. Parts corresponding to those shown in FIG. 3 are marked with the same reference numeral. For example, the flip-flops of each of the four successive stages are marked with reference numerals 34-1 . . . 34-4, etc. Stage number 1 is substantially identical to the stage shown in FIG. 3. However, successive stages in cascade are somewhat modified to reduce gate delays. Rather than providing a toggle-out signal from an AND gate such as AND gate 44 in FIG. 3 to the next succeeding stage, there is provided multiple input AND gates 60-2, 60-3, and 60-4 at the inputs of stages 2-4 respectively. Gate 60-2 has two inputs, one of which is coupled to the toggle-in signal and the other of which is coupled to the Y output of multiplexer 40-1. In stage #3, gate 60-3 has three inputs. A first input is coupled to the toggle-in signal, a second input is coupled to the Y output of multiplexer 40-1 and a third input is coupled to the Y output of multiplexer 40-2. In a similar fashion, AND gate 60-4 has a first input coupled to the toggle-in signal, a second input coupled to the Y output of multiplexer 40-1, a third input coupled to the Y output of multiplexer 40-2 and a third input coupled to the Y output of multiplexer 40-3. The outputs of gates 60-2, 60-3 and 60-4 serve as the second inputs respectively of gates 30-2, 30-3 and 30-4. A final output AND gate 70 includes five inputs, one of which is coupled to the toggle-in signal and the others of which are coupled to the Y outputs of each of multiplexers 40-1 . . . 40-4. Note that even in this embodiment, the logic architecture is significantly less than that of the traditional circuit implementation shown in FIG. 1 (PRIOR ART).

Again, the common thread in all of the embodiments discussed above is the recognition that a multiplexer can be used to eliminate multiple logic gates that would otherwise be required. This represents a significant savings for CMOS implementations which can now be made applying the present invention with less circuitry than would be required with traditional implmentations.

While the invention has been described in connection with what is presently considered to be the most practical and preferred embodiments, it is to be understood that the invention is not to be limited to the disclosed embodiments but on the contrary it is intended to various modifications and equivalent arrangements included within the spirit and scope of the appended claims which scope is to be accorded the broadest interpretation so as to encompass all such modifications and equivalent structures.

What is claimed is:

1. An up/down (U/D) counter for counting a toggle-in signal, said counter having two or more stages, each stage comprising:
   a clock flip-flop having a data input and Q and $\overline{Q}$ outputs providing a counter stage output at one of said outputs;
   a feedback circuit including an exclusive-OR gate having an input coupled to an output of said flip-flop and a second input adapted to receive a toggle-in signal and an output signal coupled to said data input of said flip-flop; and
   a multiplexer having a first input coupled to said Q output of said flip-flop and a second input coupled to said $\overline{Q}$ output of said flip-flop and a single switch control input which, depending upon the binary state of an applied up/down count control signal, selectively connects either said first input or said second input to a multiplexer output port providing toggle out data for input to another of said counter stages.

2. An up/down (U/D) counter according to claim 1 wherein said flip-flop, feedback path and multiplexer are integrated in a CMOS integrated circuit.

3. An up/down (U/D) counter according to claim 1 wherein said flip-flop, feedback path and multiplexer are integrated in a CMOS integrated circuit.

4. An up/down (U/D) counter stage, comprising:
   an exclusive-OR logic gate having a first input for receiving a toggle-in signal to be counted, a second input and an output;
   a flip-flop having a data input coupled to the output of said exclusive-OR gate, a clock input for connection to a clock signal, and Q and $\overline{Q}$ outputs, the Q output being coupled to the second input of said exclusive-OR gate and providing an output of said counter stage;
   a multiplexer having an U/D input for receiving an U/D signal for controlling whether the stage counts up or down, a first data input coupled to the Q output of said flip-flop, a second input coupled to the $\overline{Q}$ output of said flip-flop and an output; and an AND gate having a first input coupled to said output of said multiplexer and a second input coupled to also receive said toggle-in signal and having an output providing a toggle-out signal serving as the toggle-in signal for another U/D counter stage.

5. A counter according to claim 4 wherein said OR gate, flip-flop, multiplexer and AND gate are integrated in a CMOS integrated circuit.

6. An up/down (U/D) counter, comprising N counter stages coupled in cascade, each stage adapted to receive a common external U/D control signal and a common clock signal, a first stage of the cascade receiving a toggle-in signal and each of the first N-1 stages providing a toggle-out signal serving as a toggle-in signal to the next stage of the cascade, each stage providing an output, each stage comprising:

an exclusive OR logic gate having a first input for receiving said external toggle-in signal, a second input and an output;

a flip-flop having a data input coupled to the output of said exclusive OR gate, a clock input for connection to said clock signal, and Q and $\overline{Q}$ outputs, the Q output being coupled to the second input of said exclusive OR gate and providing an output of said counter stage;

a multiplexer having an U/D input for receiving said external U/D signal for controlling whether the stage counts up or down, a first data input coupled to the Q output of said flip-flop, a second input coupled to the $\overline{Q}$ output of said flip-flop and an output; and an AND gate having a first input coupled to said output of said multiplexer and a second input coupled to also receive said toggle-in signal and having an output providing said toggle-out signal serving as the toggle-in signal for a subsequent cascaded U/D counter stage.

7. A counter according to claim 6 wherein all stages of said counter are integrated in a CMOS integrated circuit.

8. An N-stage up/down (U/D) counter, comprising:
a first counter stage including:

an exclusive OR logic gate having a first input for receiving an external toggle-in signal, a second input and an output;

a flip-flop having a data input coupled to the output of said exclusive-OR gate, a clock input for connection to an external clock signal, and Q and $\overline{Q}$ outputs, the Q output being coupled to the second input of said exclusive-OR gate and providing an output of said counter stage; and a multiplexer having an U/D input for receiving an external U/D signal for controlling whether the stage counts up or down, a first data input coupled to the Q output of said flip-flop, a second input coupled to the $\overline{Q}$ output of said flip-flop and an output; and N-1 further counter stages, cascaded with said first stage, each of said further stages including:

an AND gate having a first input coupled to said toggle-in signal and additional inputs coupled to respective outputs of the multiplexers of each previous counter stage of said cascade, and an output;

an exclusive OR logic gate having a first input coupled to said output of said AND gate, a second input and an output;

a flip-flop having a data input coupled to the output of said exclusive-OR gate, a clock input for connection to an external clock signal, and Q and $\overline{Q}$ outputs, the Q output being coupled to the second input of said exclusive-OR gate and providing an output of said counter stage; and a multiplexer having an U/D input for receiving an external U/D signal for controlling whether the stage counts up or down, a first data input coupled to the Q output of said flip-flop, a second input coupled to the $\overline{Q}$ output of said flip-flop and an output; and an AND gate having a first input coupled to said output of the multiplexer of each stage and a second input coupled to said toggle-in signal and having an output providing a toggle-out signal for another U/D counter.

9. A counter according to claim 8 wherein said N-stages are integrated in a CMOS integrated circuit.

* * * * *